United States Patent [19]

Jenkins

[11] Patent Number: 4,672,915

[45] Date of Patent: Jun. 16, 1987

[54] GAS SUPPLY DEVICE, PARTICULARLY FOR MANUFACTURING SEMICONDUCTOR ELEMENTS

[76] Inventor: George M. Jenkins, 281 Restigouche Road, Oromocto, Province of New Brunswick, Canada, E2V 2H2

[21] Appl. No.: 802,732

[22] Filed: Nov. 29, 1985

[30] Foreign Application Priority Data

Nov. 30, 1984 [CA] Canada .................................. 469124

[51] Int. Cl.$^4$ ............................................. B05C 13/02
[52] U.S. Cl. .................................... 118/124; 118/500; 118/728
[58] Field of Search ............... 118/715, 728, 732, 724, 118/500

[56] References Cited

U.S. PATENT DOCUMENTS 4,466,381  8/1984  Jenkins .................................. 118/728

FOREIGN PATENT DOCUMENTS 1158109 12/1983 Canada .

Primary Examiner—Evan K. Lawrence
Attorney, Agent, or Firm—James W. Hellwege

[57] ABSTRACT

A device for supplying gases to a perforated vessel, particularly a boat or boats for processing semiconductor elements by their exposure to the gases, comprises at least one tubular perforated gas manifold disposed under the perforated part of the boat and supported on a manifold raiser. The vessel is supported on two cylindrical support members which closely abut the boat and the manifolds which in turn abut the manifold raiser along the working length of the boat and the supporting members. A relatively small gas expansion cavity is thereby created between the manifold(s) and the boat which improves the manufacturing process.

9 Claims, 5 Drawing Figures

GAS SUPPLY DEVICE, PARTICULARLY FOR MANUFACTURING SEMICONDUCTOR ELEMENTS

This invention relates to a gas supply device enabling the supply of gas or gases to a reactor or vessel, and particularly suitable for the manufacturing of semiconductor elements.

During processing of semiconductor elements, for example, silicon wafers, the elements are placed in semi-cylindrical vessels, so called boats, and exposed to the flow of a specific gas or gases therealong. This process is conducted at an elevated temperature maintained by placing the boat in a furnace, either directly or with the use of an intermediate insert.

As described in Canadian Pat. No. 1,158,109 issued Dec. 6, 1983 to Northern Telecom Limited, the semiconductor elements are placed in a boat having perforations in the bottom, the boat being then positioned on support elements in a furnace tube or in an insert which is in turn placed in the furnace. A plurality of gas manifolds is disposed below the boat between the support elements. The manifolds are provided with slots for the supplied gas to pass therethrough and into the boat or another vessel through the perforations therein.

The manifolds are located on the bottom of the furnace tube or of the insert and spaced from the support elements to facilitate the assembly of the apparatus. Thus, the gases supplied through the manifold are expanded in a relatively large space between the bottom of the boat, the supporting elements and the adjoining surface of the furnace tube or the insert.

It is desirable to reduce the area in which the expansion of process gases occurs to avoid substantial gas pressure losses between the manifold and the inside of the boat. Additionally, the flow path of the gases between the manifold outlets (apertures) and the inside of the boat should be relatively short. It may also be desirable to provide a thermocouple or another sensor in the furnace outside the boat wherein the thermocouple should be protected against intensive action of the gases.

The invention, in general, provides a device for supplying gas or gases to a perforated vessel, i.e. a vessel having slots or apertures in its wall, usually in the bottom. The device comprises at least one tubular gas manifold positioned outside and along the vessel and having at least one aperture, the manifold so disposed that the aperture is in fluid communication with the apertures of the vessel. Further, it comprises elevating means for positioning the apertured part of the manifold relatively close to the apertured wall of the vessel, and two longitudinal support members for supporting the vessel, the members disposed parallel to the manifold or manifolds on its or their outside and abutting the vessel and the manifold or manifolds substantially along their entire length whereby a longitudinal cavity is defined by, at least, the perforated well of the vessel, the manifold or manifolds and the support members. The use of the words "at least" implies that while in some embodiments of the invention only the above elements form the cavity, in other embodiments also a part of the elevating means may be involved. In order to support the vessel and provide a space for the manifolds, the support members are preferably of greater external diameter than the manifold.

In a preferable embodiment of the invention, two manifolds are provided and disposed longitudinally below and along a boat accommodating semiconductor wafers to be processed. Two support tubes are disposed on the outside of the manifolds and they are adapted to support the boat thereon. The manifolds are supported and kept in position on the convex side of the manifold elevating means which is a semi-tubular longitudinal element and which may be adapted to accommodate a thermocouple or other sensor on its concave side, thus shielding the sensor from the immediate exposure to gas flow.

The device as described below is adapted to supply gas to a boat or another vessel of semi-cylindrical elongated shape, having apertures on the bottom but may also be used for longitudinal vessels of different configurations. Instead of one, a plurality of boats or similar vessels may be used as arranged in a row. The device may be disposed in chambers of various designs, for instance in a tubular furnace.

It will be appreciated that the invention is essentially confined to a particular gas supply device; however, the vessel and the chamber constitute its immediate and cooperating environment.

The invention will be explained in more detail in the description to follow, in conjunction with the appended drawing in which.

Figure 1:
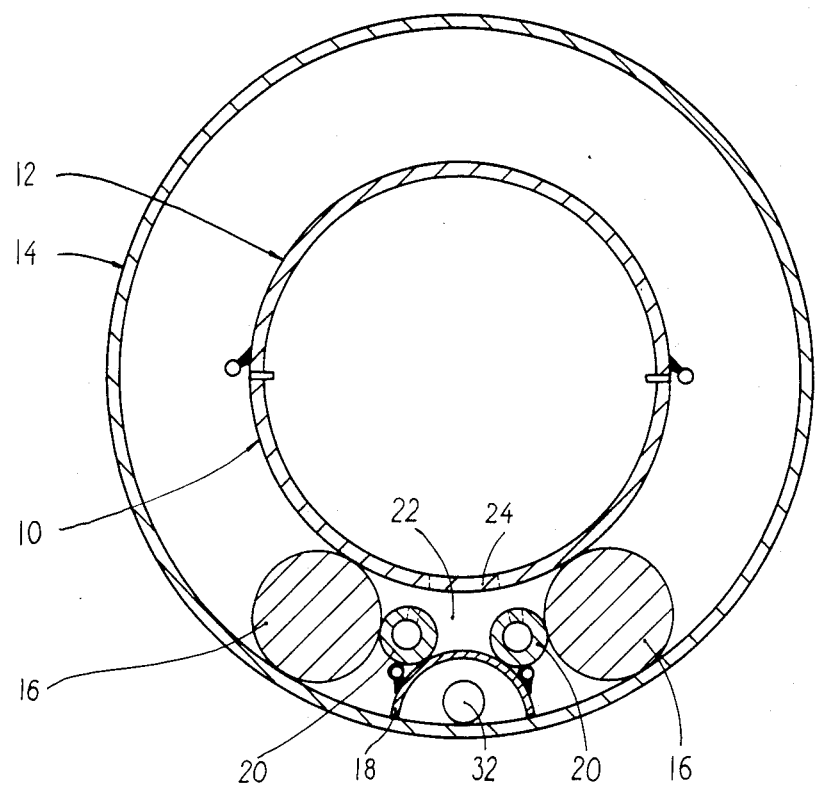
FIG. 1 is a cross-sectional view of one embodiment of the device as installed in a manufacturing apparatus.

As shown in FIG. 1, a boat 10 of quartz glass, adapted to accommodate semiconductor elements is covered with a quartz glass cover 12 and disposed within a quartz glass insert 14 which in turn is located within a furnace, not shown in the drawing. The boat 10 is supported on two quartz-glass support tubes 16 resting against the wall of the insert 14. The support tubes 16 are spaced from each other to accommodate between them a longitudinal manifold raiser 18 supporting two tubular manifolds 20. The raiser 18 and the manifolds 20 are positioned parallel to each other and to the longitudinal axis of the boat 10. The support tubes 16 abut the manifolds 20 and the external wall of the boat 10 along their working length, i.e. at least the length over which gases are fed through the manifolds 20 to the boat 10. The support tubes 16 are also disposed parallel to the manifolds 20 and the manifold raiser 18. The manifolds are quartz glass tubes with apertures spaced therealong in top surfaces thereof.

As seen in FIG. 1, a cavity 22 is formed between the part of the wall of the boat 10 which has perforations 24, the support tubes 16 and the manifolds 20. In this embodiment, the cavity is also defined from the bottom, by the manifold raiser 18. Due to the provision of the raiser 18, perforations in the top surfaces fo the manifolds 20 are set relatively close to the perforations 24 of the boat 10 and they are in fluid communication with each other.

Figure 4:
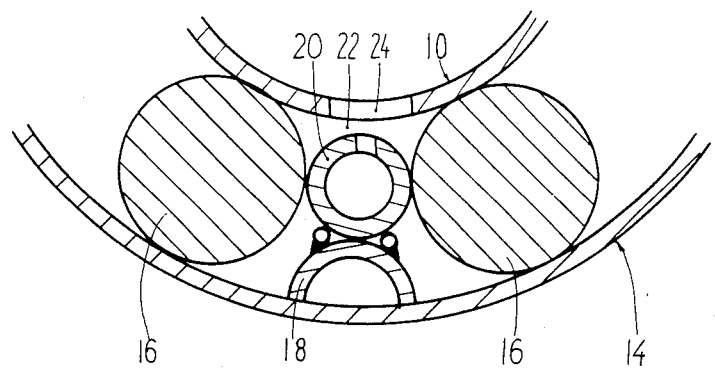
FIG. 4 is a cross-sectional view of another embodiment of the device.

FIG. 4 shows an embodiment similar to that presented in FIG. 1 except that only one manifold 20 is provided in the space between the boat 10 and the insert 14.

Figure 2:
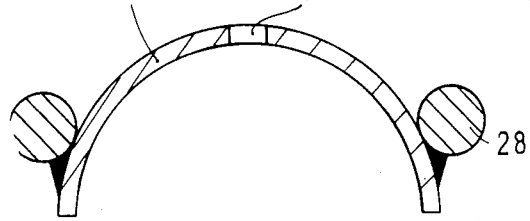
FIG. 2 is a cross-sectional view of the manifold elevating element.
Figure 3:
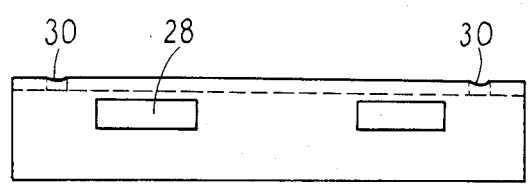
FIG. 3 is a side view of the element of FIG. 2.

The manifold raiser is shown in FIGS. 2 and 3 in more detail. It comprises a semi-tubular member 26 of quartz glass or other suitable material. To the member 26 are welded short rods or fins 28 which provide support for the manifolds 20. On both ends of the member 26 are drilled two openings 30 through which gases can enter the concave space formed under the member 26. A thermocouple 32 is installed in the concave space. The access to the thermocouple is limited to the two openings 30 and thus the thermocouple is protected to some degree against adverse effects of the gases thereon. Instead of or in addition to a thermocouple, other measuring or sensing means may be installed in the space, or the space may be left void.

As shown in FIG. 4, a cavity 22 is formed by the support tubes 16, the wall of the boat 10 and the manifold 20 in case only one manifold is provided.

Figure 5:
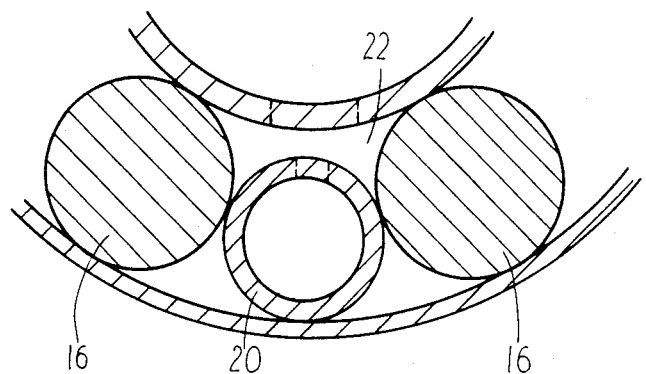
FIG. 5 shows, in cross-section, a simplified gas supply device of the invention.

FIG. 5 shows a simplified version of the device according to the invention. One manifold 20 is installed between the support tubes 16 adhering thereto, the manifold 20 being supported directly on the insert 14 (or on the furnace, not shown). A relatively small longitudinal cavity 22 is thereby formed, similarly as in the embodiment of FIG. 4, however, no raiser is provided to elevate the manifold with the apertures toward the boat perforations 24. Instead, the manifold is of relatively large external diameter, only slightly smaller than the diameter of the support tubes 16. The enlarged, as compared to that in FIG. 1, external diameter of the manifold 20 performs some of the functions of the manifold raiser 18, viz. positions the manifold relatively close to the perforated wall of the boat 10. The embodiment shown in FIG. 5, however, does not have all the advantages of the invention; it is very difficult, for instance, to install a thermocouple in the gas flow area and to protect it, as described above, against the gases. Also, stability of the device and the boat may be relatively weak. If more than one gas is required in the process, it is usually practical to use more than one manifold.

The advantages of the invention are as follows. First, a relatively small cavity, as compared to the prior art system, is created. This reduces the expansion volume available to the gases outflowing from the manifolds and thus reduces the gas pressure drop between the manifold and the vessel, or boat. Next, raising the manifold toward the boat allows gases to be injected closer to the process zone in the boat, which, in case of the manufacturing of semiconductor wafers improves the uniformity of the gas flow across the wafers and improves the efficiency of gas usage. Another advantage lies in that a thermocouple can readily be installed in the gas supply area close to the boat, the thermocouple being protected, to some degree, from the adverse effects of the process gases. The latter advantage results from the particular design of the manifold raiser 18 as shown in FIGS. 1 and 4.

The device may be assembled manually or automatically, the ultimate goal being that the boat (or another vessel) be supported on the support members which are set as close as possible to the manifolds installed therebetween and abut longitudinally the manifolds as well as the boat so that a relatively tight and small longitudinal cavity is created along the boat.

The manifold raiser 18 may be of quartz glass, but it may also be made of different material, for example an elastic material whereby the contact between the raiser and the manifold along their length is facilitated.

The longitudinal cavity 22 may be closed at one or both ends thus substantially eliminating gas escape therethrough. Gases may be fed to manifolds 20 either from one end or from both ends depending on the system design.

The embodiments of the invention in which an exclusive property or privilege is claimed are defined as follows:

1. A device for supplying gas to a vessel having a plurality of apertures in its wall, the device comprising:
    at least one tubular gas manifold positioned outside and along the vessel and having a plurality of apertures being in fluid communication with the apertures of the vessel;
    elevating means for positioning the apertures in the manifold or manifolds relatively close to the apertured wall of the vessel; and
    two longitudinal support members for supporting the vessel, disposed on the outside of the manifold or manifolds parallel thereto, the support members abutting the vessel and the manifold essentially along their working length, whereby a longitudinal cavity is defined at least by the perforated wall of the vessel, the manifold or manifolds and the support members.

2. A device as claimed in claim 1 having two said manifolds.

3. A device as claimed in claim 1 wherein the support members are of cylindrical shape.

4. A device as claimed in claim 1 wherein the elevating means is a longitudinal semi-tubular element adapted to support said manifold in an elevated position on its convex surface and abutting the manifold along its entire length.

5. A device claimed in claim 4 wherein the elevating means is adapted to accommodate a temperature sensing means in a longitudinal cavity on its concave side.

6. A device as claimed in claim 1 wherein said vessel is a boat or a plurality of boats for processing semiconductor elements.

7. A device as claimed in claim 1 further including the vessel.

8. A device as claimed in claim 1 further including the vessel and disposed in a furnace.

9. A device as claimed in claim 3 wherein the support members are of greater diameter than the manifold.

* * * * *